United States Patent [19]

Yasutomi et al.

[11] Patent Number: 5,200,373

[45] Date of Patent: Apr. 6, 1993

[54] HIGH STRENGTH COMPOSITE CERAMIC STRUCTURE AND PROCESS FOR PRODUCING THE SAME

[75] Inventors: Yoshiyuki Yasutomi; Seiji Watahiki, both of Katsuta; Junji Sakai, Ibaraki; Akio Chiba; Tadahiko Miyoshi, both of Hitachi; Masahisa Sobue, Mito, all of Japan

[73] Assignee: Hitachi, Ltd., Tokyo, Japan

[21] Appl. No.: 670,734

[22] Filed: Mar. 18, 1991

[51] Int. Cl.$^5$ .................. C04B 35/58; C04B 41/87; C04B 38/00; C23C 16/34

[52] U.S. Cl. .................................. 501/97; 501/95; 501/154; 501/92; 501/96; 501/98; 427/70; 427/255.2

[58] Field of Search ............... 501/97, 95, 154, 92, 501/96, 98; 427/70, 255.2

[56] References Cited

U.S. PATENT DOCUMENTS

| | | | |
|---|---|---|---|
| 4,580,524 | 4/1986 | Lackey, Jr. et al. | 427/255.2 |
| 4,725,456 | 2/1988 | Watanabe et al. | 427/255.5 |
| 4,741,925 | 5/1988 | Chaudhuri et al. | 427/255.5 |
| 4,908,171 | 3/1990 | Claussen et al. | 501/97 |
| 4,923,829 | 5/1990 | Yasutomi et al. | 501/97 |

FOREIGN PATENT DOCUMENTS

| | | |
|---|---|---|
| 0286127 | 7/1988 | European Pat. Off. . |
| 88169 | 5/1983 | Japan . |
| 140873 | 8/1983 | Japan . |
| 101465 | 5/1986 | Japan . |

OTHER PUBLICATIONS

Advanced Ceramic Materials, vol. 3, No. 4, Jul., 1988; pp. 415–417.

High-Tech Materials Alert, vol. 5, No. 3, Mar., 1988, p. 1.

Japanese Patent Kokai (Laid-Open) No. SHO 61-101465.

Japanese Patent Kokai (Laid-Open) No. Sho 58-140375.

Japanese Patent Kokai (Laid-Open) No. Sho 58-88169.

J. Ceram. Soc. of Japan, 91, [11], (1983), pp. 49–497.

J. Ceram. Soc. of Japan, "Mechanical Properties of Silicon Nitride Ceramic Composite Reinforced with Silicon Whisker", 91 (11), 1983, pp. 491–497.

Emergent Process Methods For High-Technology Ceramics; Ed.; Davis et al "Synthesis of Powders and Thin Films by Laser Induced Gas Phase Reactions", J. Waggerly, pp. 137–151, 1984.

Primary Examiner—Mark L. Bell
Assistant Examiner—C. M. Bonner
Attorney, Agent, or Firm—Antonelli, Terry, Stout & Kraus

[57] ABSTRACT

The present invention is a composite ceramic structure having a porosity of 5 to 40% by volume comprising particles selected from the group consisting of grains and whiskers of at least one inorganic compound AB, where B is oxygen, nitrogen or carbon and A is any metal so the difference in electronegativity between A and B is less than 1.7; or particles selected from the group consisting of grains and whiskers of an inorganic compound, where there is a difference of 1.7 and higher between the components, and having layers of the inorganic compound AB formed on the surfaces of the particles. The particles are bonded together by silicon nitride particles having an average particle size of less than 0.2 micron. The composite ceramic structure is produced by sintering a shape composed of particles of AB or composed of particles having layers of AB formed on the surfaces of the particles in a gaseous atmosphere containing silicon and nitrogen to grow silicon nitride particles on the surfaces of the shaped inorganic particles.

11 Claims, 10 Drawing Sheets

φ30.9 ± 0.1 mm (1) φ110 ± 0.2      (2) φ90 ± 0.2 ial members for use in engines and turbines and a process for producing the same. Moreover, the present invention relates to a sintered ceramic product having a surface configuration accurate in dimension as being an accurate replica of the surface contours of a mold.

HIGH STRENGTH COMPOSITE CERAMIC STRUCTURE AND PROCESS FOR PRODUCING THE SAME

BACKGROUND OF THE INVENTION

1. Field of the Invention

The present invention relates to a composite ceramic structure, and more particularly to a high strength composite ceramic structure suitable for structural members for use in engines and turbines and a process for producing the same. Moreover, the present invention relates to a sintered ceramic product having a surface configuration accurate in dimension as being an accurate replica of the surface contours of a mold.

2. Description of Related Art

There have been generally known SiC and $Si_3N_4$ which have an excellent heat resistance as engineering ceramics suitable for structural members in engines, turbines and the like. Since the SiC and $Si_3N_4$ are compounds having strong covalent bonds, however, these nitrides alone are difficult to sinter and hence require sintering aids to produce sintered shapes.

For example, it has been recognized that when $Si_3N_4$ is sintered under ambient pressure, an addition of $Y_2O_3$ or $Al_2O_3$ permits the production of highly dense sintered shapes. However, because the glass phase produced with the sintering aids is softened at high temperatures, the mechanical properties of the sintered shapes are lowered at high temperatures. In order to prevent the reduction in strength at high temperatures, an attempt has been made to use as small amount of the sintering aids as possible, or to crystallize the glass phases at the grain boundaries attributable to the sintering aids. However, no complete solution has been achieved yet.

On the other hand, though an enhancement in the strength of the composites at high temperatures by incorporating whiskers of SiC, $Si_3N_4$, and the like, so-called a reinforcing technique with fibers has been proposed [see, J. Ceram. Soc. of Japan, 91, [11], (1983) pp.491–497], this also employs the sintering aids causing a significant reduction in the mechanical properties of the sintered shapes.

Another technique for sintering the ceramic composites comprising two kinds of inorganic compounds different in characteristics from each other without using any sintering aids, for example, a bonding reaction process has been known (see, Japanese Patent KOKAI (Laid-open) No. Sho 61-101465). Since this prior process employs metallic silicon particles of an average size of 0.5 μm or more, however, the resulting materials studied were macroporous sintered shapes having a maximum pore size of not less than 30 μm in which relatively large silicon nitrides bond spaces of SiC particles. For this reason, attainment of high strength of the sintered shapes has been limited. There has been studied no method for supplying silicon nitrides from a gaseous source. With respect to ceramic composites comprising two or more kinds of inorganic compounds, requirements for achieving high bonding strength have not been clarified and no high strength ceramic has been obtained so far.

SiC and $Si_3N_4$ which have an excellent heat resistance are known as engineering ceramics generally suitable for structural members for use in engines, turbines and the like. There are techniques for sintering SiC and $Si_3N_4$ such as an ordinary pressure method, a high pressure method, and a reaction-sintering method. Among them the ordinary pressure method and the high pressure method suffer from deformation and less accuracy in dimensions as causing a rate of variation in size of 15 to 20% so that a high level of technique is required. On the other hand, the reaction-sintering method is known to cause a lower rate of variation in size at the sintering process than those by other sintering methods, but still in the range of 1 to 1.5% [Japanese Patent KOKAI (Laid-open) No. Sho 58-140375]. Materials expected to have a lower rate of variation in size at the time of sintering include $Si_3N_4$ binder which has been used heretofore in refractories, but which has only a mechanical strength as low as 50 $MN/m^2$ [see, Japanese Patent KOKAI (Laid-open) No. Sho 58-88169], unsuitable for use in structural members. The high rate of variation in size at the time of sintering imposes time consumption and high cost on processing after sintering, which is one of the reasons why the engineering ceramics have not been widely used. Therefore, there has been heretofore no technique, nor practical method of producing ceramics excellent in the accuracy in dimension.

SUMMARY OF THE INVENTION

It is an object of the present invention to provide a composite ceramic structure excellent as engineering materials for use in engines and turbines.

It is another object of the present invention to provide a process for producing the composite ceramic structure as described above.

It is still another object of the present invention to provide a sintered ceramic shape which is allowed to be a highly accurate replica of the surface contour of a mold almost without any further processing, i.e., has a high accuracy in dimension and a smaller rate of variation in dimension received at the time of sintering.

According to the present invention, there is provided a composite ceramic structure having an unusually high strength by firmly bonding inorganic compounds with silicon nitrides particles of an average particle size no more than 0.2 μm, and/or making the sintered shape to have a porosity of 5 to 40% by volume with the maximum pore size of 10 μm or less.

DETAILED DESCRIPTION OF PREFERRED EMBODIMENTS

Figure 1:
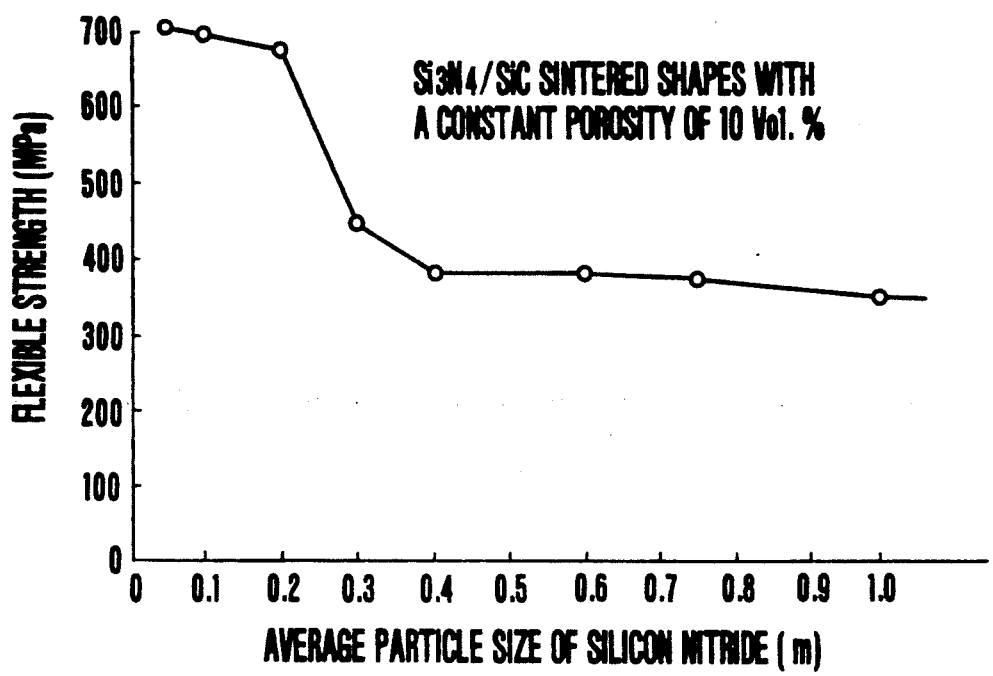
FIG. 1 is a graph showing a relationship between the average particle size of silicon nitrides and the flexure strength for $Si_3N_4$/SiC sintered shape constantly with a porosity being of 10% by volume obtained in Example 38.

In an aspect of the present invention, there is provided a composite ceramic structure, a sintered ceramic shape having a porosity of 5 to 40% by volume comprising particles selected from the group consisting of grains and whiskers of at least one inorganic compound AB selected from the group consisting of carbides, nitrides, and oxides which are composed of an element A and an element B, where a difference in electronegativity between the element A and the element B is not higher than 1.7, said particles being bonded one another with silicon nitride particles or granules having an average particle size not more than 0.2 $\mu$m.

In another aspect of the present invention, there is provided a composite ceramic structure, a sintered ceramic shape having a maximum pore size of 10 $\mu$m and a porosity of 5 to 40% by volume comprising particles selected from the group consisting of grains and whiskers of at least one inorganic compound AB selected from the group consisting of carbides, nitrides, and oxides which are composed of an element A and an element B, where a difference in electronegativity between the element A and the element B is not higher than 1.7, said particles being bonded one another with silicon nitrides particles or granules.

In still another aspect of the present invention, there is provided a composite ceramic structure, a sintered ceramic shape having a maximum pore size of 10 $\mu$m and a porosity of 5 to 40% by volume comprising particles selected from the group consisting of grains and whiskers of at least one inorganic compound AB selected from the group consisting of carbides, nitrides, and oxides which are composed of an element A and an element B, where a difference in electronegativity between the element A and the element B is not higher than 1.7, said particles being bonded one another with silicon nitride particles or granules having an average particle size of not more than 0.2 $\mu$m.

In still another aspect of the present invention, there is provided a composite ceramic structure, a sintered ceramic shape having a porosity of 5 to 40% by volume comprising particles selected from the group consisting of grains and whiskers of an inorganic compound, between the components of which a difference in electronegativity is higher than 1.7, said particles having layers of an inorganic compound AB composed of at least one selected from the group consisting of carbides, nitrides, and oxides which comprise an element A and an element B, where a difference in electronegativity between the element A and the element B is not higher than 1.7 formed on the surfaces of said particles and being bonded one another with silicon nitride particles or granules having an average particle size not more than 0.2 $\mu$m.

In still another aspect of the present invention, there is provided a composite ceramic structure, a sintered ceramic shape having a maximum pore size of 10 $\mu$m and a porosity of 5 to 40% by volume comprising particles selected from the group consisting of grains and whiskers of an inorganic compound, between the components of which a difference in electronegativity is higher than 1.7, said particles having layers of an inorganic compound AB composed of at least one selected from the group consisting of carbides, nitrides, and oxides which comprise an element A and an element B, where a difference in electronegativity between the element A and the element B is not more than 1.7, formed on the surfaces of said particles and being bonded one another with silicon nitride particles or granules.

In still another aspect of the present invention, there is provided a composite ceramic structure of sintered ceramics having a maximum pore size of 10 $\mu$m and a porosity of 5 to 40% by volume comprising particles selected from the group consisting of grains and whiskers of an inorganic compound, between the components of which a difference in electronegativity is higher than 1.7, said particles having layers of an inorganic compound AB composed of at least one selected from the group consisting of carbides, nitrides, and oxides which comprise an element A and an element B, where a difference in electronegativity between the element A and the element B is not higher than 1.7, formed on the surfaces of said particles and being bonded one another with silicon nitride particles or granules having an average particle size of not more than 0.2 $\mu$m.

In the present invention, inorganic compound particles or whiskers are bonded with silicon nitrides particles. The silicon nitrides may be derived from metallic silicon as starting material or from gaseous sources. The starting metallic silicon should be of an average particle size of 0.3 $\mu$m or smaller.

The present invention will now be disclosed in detail.

The reasons why the silicon nitrides for bonding the inorganic compounds should have an average particle size not more than 0.2 $\mu$m are based on the findings that if it is made so, one can achieve a distribution of pores of uniform sizes not more than several microns existing between the particles and that the mechanical strengths of the resultant composite ceramic structures can be greatly enhanced.

Figure 2:
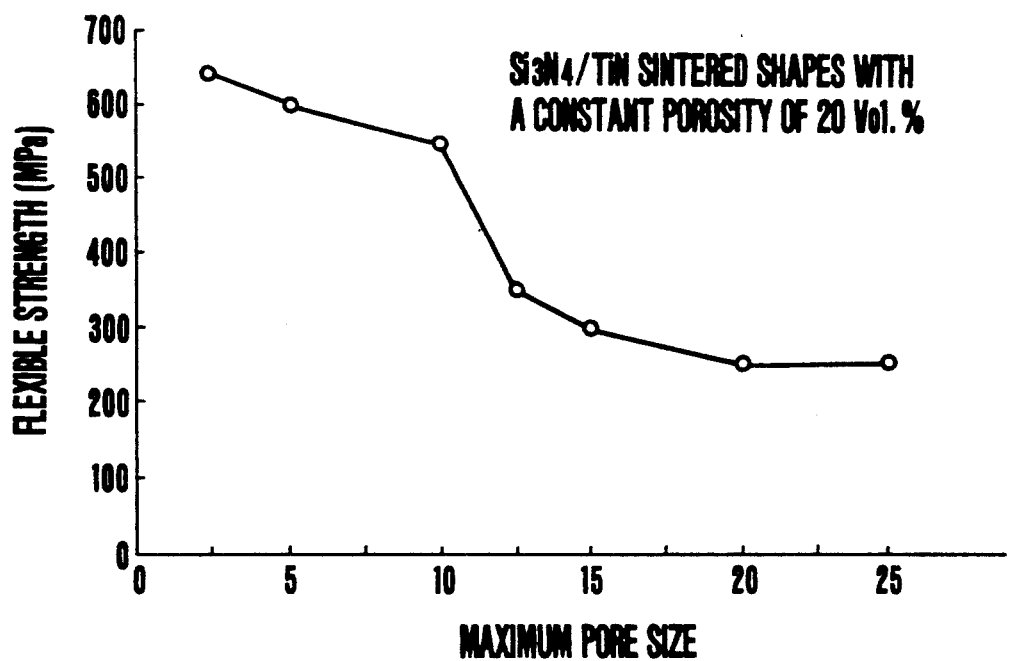
FIG. 2 is a graph showing a relationship between the maximum porosity and the flexure strength for $Si_3N_4$/SiC sintered shape constantly with a porosity being of 20% by volume obtained in Example 39.

FIG. 1 is a graph showing a relationship between the average particle size and the flexure strength of the silicon nitrides in the $Si_3N_4$/SiC sintered shapes having a constant porosity of 10% by volume obtained in Example 38. It can be seen from the graph that the strength is rapidly increased nearly by a factor of 2 as the average particle size is 0.2 $\mu$m. When the average particle size is more than 0.2 $\mu$m, the pore size becomes larger and fractures may start from the pores of the maximum size causing an reduction in the strength. FIG. 2 is a graph showing a relationship between the maximum porosity and the flexure strength of the Si$_3$N$_4$/TiN sintered shapes having a constant porosity of 20% by volume obtained in Example 39. It can be seen from this graph that the strength is rapidly increased nearly by a factor of 2 as the maximum pore size is 10 μm or less. This may be because fractures start from the pores of the maximum size. Therefore, it is extremely important to render the maximum pore size not more than 10 μm, preferably not more than 5 μm which implies the necessity of the average particle size being not more than 0.2 μm.

In order to achieve the average particle size of 0.2 μm and the maximum pore size of not more than 10 μm of the silicon nitride particles for bonding the inorganic compounds, the metallic silicon particles to be mixed with the inorganic compounds should have an average particle size not more than 0.3 μm, and the sintering temperature should be 1250° C. The metallic silicon particles to be used may be those which have hydroxide coatings formed on the surfaces thereof.

The present composite ceramic structures may be obtained by heating a shape composed of inorganic compounds or a combination of inorganic compounds and metallic silicon particles having an average particle size of 0.3 μm or less in an atmosphere containing silicon and nitrogen, e.g., in an atmosphere of gaseous ammonia and silane. Alternatively, they may be obtained by epitaxially growing an amorphous silicon nitrides and then heat-treating the nitrides to crystallize. Still alternatively, they may be obtained by heating a shape composed of inorganic compounds and silicon nitrides having an average particle size of 0.2 μm or less as a binder in an atmosphere containing silicon and nitrogen.

The silicon nitrides for bonding the inorganic compounds in the present invention should be preferably a silicon nitrides produced through by epitaxial growth, because this type of silicon nitrides has in most cases a particle size not more than 0.1 μm with smaller particles in the order of several nanometers allowing pore sizes small and uniform. Epitaxially growing particles, whiskers are predominantly of silicon nitrides phase, and should preferably comprise 70% or more silicon nitrides, because a higher amount of oxynitrides produced reduces the bonding strength between inorganic compounds.

The present invention requires that a difference in electronegativity between the inorganic compound A and the inorganic compound B be not higher than 1.7, where the difference in electronegativity is as determined by L. Pauling, for the reasons found from our experiments that such inorganic compounds as the difference in electronegativity therebetween being higher than 1.7, in other words as having a higher ionic bonding strength therebetween have a less capability of epitaxially growing silicon nitride particles or whiskers on their surfaces so that they cause reduced bonding strengths.

The electronegativity defines an ability of an atom to attract electrons at the time of forming an chemical bond, as the magnitudes of the electronegativities were determined by L. Pauling making a calculation using the following equation:

$$\Delta_{AB} = D_{A-B} - (\tfrac{1}{2})(D_{A-A} + D_{B-B})$$

where D is a bonding energy.

Inorganic compounds AB having a difference in electronegativity between the element A and the element B of not higher than 1.7 include nitrides, carbides and oxides of Si, Ti, Zr, Cr, Cl, Be, Ta, Th, Hf, Nb, W, V, Fe, or Mo, as the element A which have preferably a higher bonding strength. The magnitudes of the electronegativities determined by L. Pauling are tabulated in Table 1. Processes of bonding the inorganic compounds with silicon nitrides in the presence of sintering aids cause deformations due to large contractions from moldes to sintered shapes as well as formations of remaining solution phases (alloy phases) softenable at high temperatures in the sintered shapes which result in an reduction in strength. In contrast, in the present invention, the bonding at least one of carbides, nitrides and oxides as the inorganic compounds having the difference in electronegativity of not higher than 1.7 one another with crystalline silicon nitride particles or epitaxially grown silicon nitride particles or whiskers enables the sintering of molds causing little contraction in dimension at the time of the sintering without any reduction in strength at high temperatures because of no formation of such solution phases softenable at high temperatures.

TABLE 1

| Magnitude of Electronegativity | | | | | | | | | | | | | | | | | |
| --- | --- | --- | --- | --- | --- | --- | --- | --- | --- | --- | --- | --- | --- | --- | --- | --- | --- |
| Li | Be | B | | | | | | | | | | | | C | N | O | F |
| 1.0 | 1.5 | 2.0 | | | | | | | | | | | | 2.5 | 3.0 | 3.5 | 4.0 |
| Na | Mg | Al | | | | | | | | | | | | Si | P | S | Cl |
| 0.9 | 1.2 | 1.5 | | | | | | | | | | | | 1.8 | 2.1 | 2.5 | 3.0 |
| K | Ca | Sc | Ti | V | Cr | Mn | Fe | Co | Ni | Cu | Zn | Ga | Ge | As | Se | Br |
| 0.8 | 1.0 | 1.3 | 1.5 | 1.6 | 1.6 | 1.5 | 1.8 | 1.8 | 1.8 | 1.9 | 1.6 | 1.6 | 1.8 | 2.0 | 2.4 | 2.8 |
| Rb | Sr | Y | Zr | Nb | Mo | Tc | Ru | Rh | Pd | Ag | Cd | In | Sn | Sb | Te | I |
| 0.8 | 1.0 | 1.2 | 1.4 | 1.6 | 1.8 | 1.9 | 2.2 | 2.2 | 2.2 | 1.9 | 1.7 | 1.7 | 1.8 | 1.9 | 2.1 | 2.5 |
| Cs | Ba | La—Lu | Hf | Ta | W | Re | Os | Ir | Pt | Au | Hg | Tl | Pb | Bi | Po | At |
| 0.7 | 0.9 | 1.1–1.2 | 1.3 | 1.5 | 1.7 | 1.9 | 2.2 | 2.2 | 2.2 | 2.4 | 1.9 | 1.8 | 1.8 | 1.9 | 2.0 | 2.2 |
| Fr | Ra | Ac | Th | Pa | U | Np—No | | | | | | | | | | |
| 0.7 | 0.9 | 1.1 | 1.3 | 1.5 | 1.7 | 1.3 | | | | | | | | | | |

The present invention requires carbides, nitrides and oxides of the inorganic compounds having a difference in electronegativity between one element A and the other element B composing the compounds for the reason that borides and silicides are difficult to be made of an average particle size not more than 0.2 μm because they are reactive with silicon nitrides.

In case the inorganic compounds have a difference in electronegativity of higher than 1.7, particles of the compounds can be bonded one another by oxidizing or nitriding the inorganic compounds to produce films having a difference in electronegativity of not higher than 1.7 on the surfaces of the compounds, and thereafter, bonding the particles with crystalline silicon nitride particles or epitaxially grown particles or whiskers via the intervening films.

Figure 10:
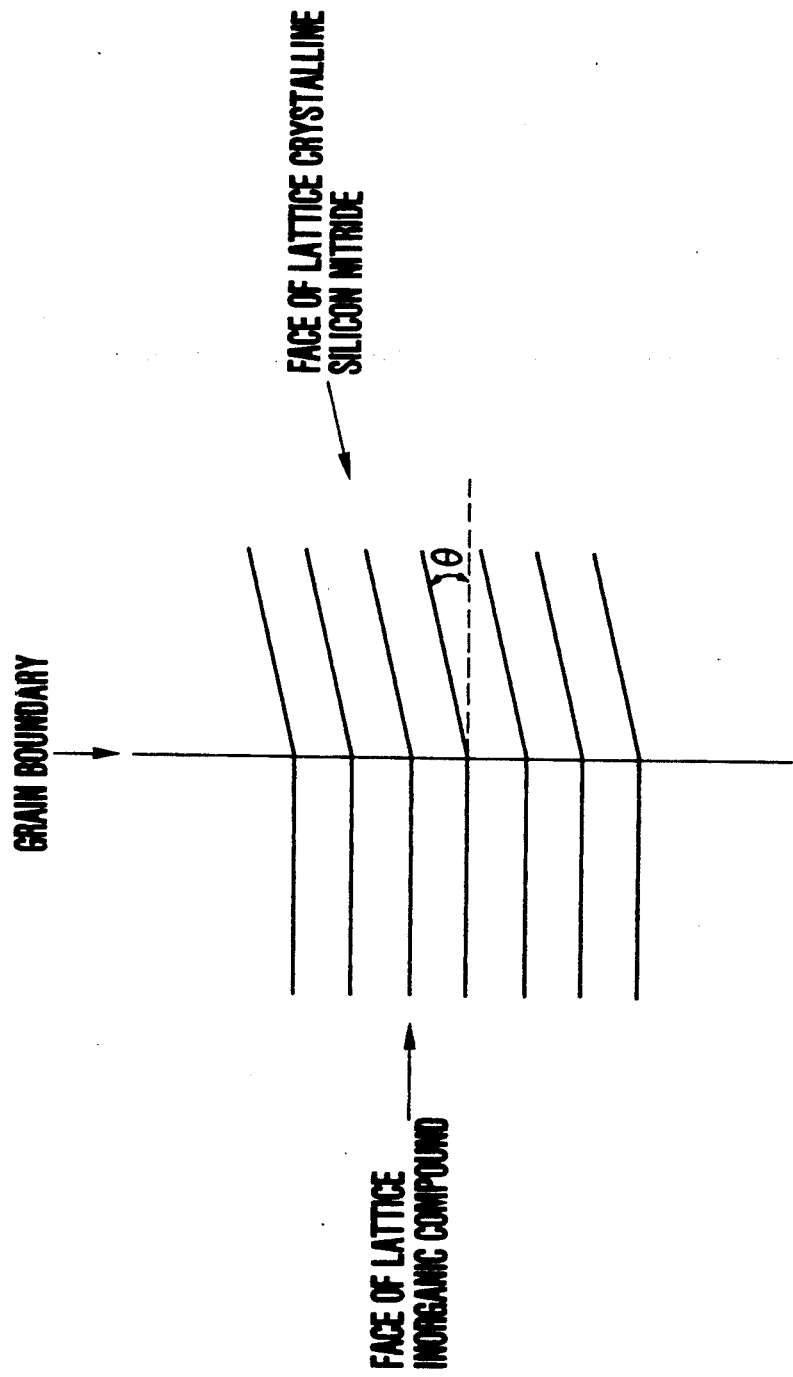
FIG. 10 is a schematic view of the lattice intersecting angle between the inorganic compound and the crystalline silicon nitrides.

As can be seen from FIG. 10, a lattice crossing angle $\theta$ between the inorganic compound and the epitaxially grown silicon nitride should preferably be 70° or lower. If the angle is higher than 70°, shearing strength and tensile strength between particles are reduced, resulting in a reduction in mechanical strength.

The reasons why a porosity be 5 to 40% in the present invention are that the porosity over 40% lowers rapidly the strength. The porosity lower than 5% is inadequate for the epitaxial growth by reaction in vapor phase because pores allowing gases to pass through are required. It may be satisfactorily effected, however, to densify the shapes by HP or HIP after completing the treatment for the epitaxial growth. In this way densely sintered shapes having no glass layer in grain boundaries can be produced. Preferably particles having an average particle size of 20 $\mu$m or less and/or whiskers having an aspect ratio not higher than 100 and a length not longer than 100 $\mu$m should be used for the inorganic compounds, because the average particle size over 20 $\mu$m, the aspect ratio over 100 and the length over 100 $\mu$m make it difficult to mix the particles producing a less uniform dispersion state which in turn makes it difficult for the maximum pore size to be 10 $\mu$m or less, preferably 5 $\mu$m or less. For the inorganic compounds, commercially available ones may be used as they are. Alternatively, roundish particles produced by grinding with a mill may be used. Particularly, the more round the particles, the higher the strength due to a higher uniformity in pore size within the sintered shapes.

Preferably a content of inorganic compound materials in the sintered shapes should be in the range of 5 to 80%, since if it is higher than 80% by volume, an amount of the materials to be bonded with the epitaxially grown silicon nitrides is reduced, which lowers the mechanical strength of the sintered ceramics. If it is lower than 5% by volume, little effect of the inorganic compounds on preventing the propagation of cracking is achieved resulting in an reduction in the mechanical strength.

In the process for epitaxially growing crystalline silicon nitrides on the surfaces of the inorganic compounds, the silicon nitrides are grown and piled on each other on the surfaces of the inorganic compounds to bond the particles, under the conditions that the shapes of the inorganic compounds are present in an atmosphere containing Si and N and that the potential energy of the inorganic compounds is lower compared with the reaction of Si and N. The crystalline silicon nitrides may be obtained by heat-treating the amorphous silicon nitrides epitaxially grown to crystallize the same. The use of molecular beams and the like are also effective.

It is possible to impregnate the pores of the sintered composite ceramics with resins, particles, oils, solid lubricants and the like. The impregnation of the uniform small pores with materials as described above enables the production of slidable materials having a lower coefficient of friction.

To form shapes, various forming processes may be employed such as injection molding, press molding, casting, rubber press, extrusion, powder molding with metal dies, and the like depending upon shapes and properties to be required. Alternatively, it may be possible to remove, form and sinter fine Si materials in a glow box.

The characteristics of the composite ceramics to be produced may be varied depending upon the type of the inorganic compounds as well as the formulation ratio of the inorganic compounds and silicon nitrides. For example, the use of electroconductive inorganic compounds produces electroconductive composite ceramics. Ceramic composites characterized by having a electric resistivity in the order of $10^{-7}$ $\Omega$m to $10^{15}$ $\Omega$m can be obtained by controlling the types and the formulation ratios of the inorganic compounds.

High strength composite ceramic structures can be produced by rigidly bonding at least one of carbides, nitrides, and oxides of the inorganic compounds, which have a difference in electronegativity of not higher than 1.7, one another with silicon nitride particles of an average particle size not more than 0.2 $\mu$m or silicon nitride whiskers, and sintering the bonded materials into sintered shapes having a maximum pore size of not more than 10 $\mu$m, preferably not more than 5 $\mu$m.

The composite ceramic structures produced by the present invention will find broadening areas of application with regard to ceramics useful as structural members such as engines, turbines, slide parts as well as those useful for developments in airospace, iron and steel, and marine technologies.

The present invention provides a precise mechanical part characterized by having a surface which is a precise replica of the surface configuration of a mold and by being a sintered ceramic shape having highly accurate dimensions.

The sintered ceramic shape of highly precise dimensions having a surface which is a replica of the surface configuration of a mold can be produced by adding a molding binder to a material mix consisting of powdery metal or a combination of powdery metal and inorganic compounds, forming the mixture with a mold having a configuration near to a desired end product to produce a shape, removing the binder in the shape, thereafter heating the shape in an nitriding gaseous atmosphere to bond the particles with the nitride particles or whiskers grown from the metal grains.

It may be possible particularly as disclosed in Japanese Patent KOKAI (Laid-open) No. sho 63-277576 that a sintered shape with a rate of variation in dimension at the time of sintering on the order of about +0.1% may be produced by bonding inorganic compounds with nitrides grown from Si grains. However, there is no discussion about a mold taking account of an amount of the dimensional spring back of a pressed shape and/or a rate of variation in dimension from the shape to the sintered one.

In order to achieve the sintered ceramic shape of a high accuracy in dimension having a surface which is a replica of the surface configuration of a mold in the present invention, a fluctuation in dimension of sintered shapes should be minimized by using a mold taking account of an amount of the dimensional spring back of a shape pressed with a mold and/or a rate of variation in dimension at the time of sintering, thereby enabling the achievement.

The molding binders to be used in the present invention include organic high molecular weight compounds such as polyvinyl butyrals and polyethylenes and organic Si high molecular weight compounds such as silicon imido compounds and polysilane compounds. The binders should be added in an appropriate amount, preferably 8 to 12 parts by weight to allow the shape to have a particle packing ratio of the shape of 70% by volume.

The forming method may be selected from various froming methods such as injection molding, press forming with a metal die, casting, extrusion, and the like depending upon required configuration and properties.

The shapes should preferably be heated in an atmosphere of nitrogen and/or ammonia with an addition of hydrogen, argon, helium, or the like, if necessary, at a temperature of below the melting point of metallic Si.

In the present invention, preferably inorganic compounds in the forms of particles having an average particle size not more than 100 $\mu$m and/or whiskers having an average aspect ratio of 200 and an average length not longer than 200 $\mu$m should be used, because an average particle size over than 100 $\mu$m, an average aspect ratio over 100 and an average length over 200 $\mu$m make mixing difficult to produce an unsatisfactory dispersion state.

As the powdery metals and the inorganic compounds, commercially available ones may be used as they are. Alternatively, roundish particles produced by grinding with a mill or the like may be used.

Any surface configurations complicated two or three dimensionally of molds such as stair-type, embossed pattern, or the like can be duplicated onto the present sintered shapes.

In the present invention, the sintered ceramics may be impregnated with resins, particles, oils, metals and the like into the pores thereof.

The present invention can produce sintered ceramic shapes highly accurate in dimension having a surface which is a precise replica of the suface configuration of a mold, which ceramics can be used as precision mechanical parts of ceramics without any additional processing, or with little processing, if any. They are useful for various mechanical seals, miniature toothed wheels, various heaters, various far infra-red heaters, electrodeposition, electrodeposition brushes, various bearings, commutators, vanes, wire guides, rings, Oldham's rings, screw rotors, turbochargers, side combustion room, guide rails for magnetic disks, and the like.

The present invention will be further described in detail with reference to the following Examples which are not intended to limit the present invention.

EXAMPLE 1

To SiC particles having an average particle size of 5 $\mu$m (a difference in electronegativity: 0.7), 2 parts by weight of polyvinyl alcohol (PVA) were added as a molding binder and the whole was mixed to produce a sample material. The material was pressed with a mechanical press under a molding pressure of 100 kgf/cm$^2$ into disks of 50 mm in diameter $\times$ 20 mm in thickness. From these shapes, the molding binder was removed. The binder removed shapes were placed centrally in a tube furnace having an inside diameter of 50 mm as filling the inside of the furnace with the disks, and heated at a temperature of 1300° C. for a long time with passing a flow of a gaseous mixture of SiH$_4$ and NH$_3$ through the furnace. In this way there were produced sintered shapes where Si$_3$N$_4$ whiskers/particles were epitaxially grown on the SiC particles. The resultant sintered shapes had a compositional ratio of SiC:-Si$_3$N$_4$=45:55 in terms of % by volume Figures showing the process of the epitaxial growth of Si$_3$N$_4$ whiskers and particles on the SiC particles observed with a scanning electron microscope (SEM) are given in FIGS. 3 and 4. It is evident from the Figures how the Si$_3$N$_4$ whiskers and particles were epitaxially grown on the SiC particles.

Figure 5:
FIG. 5 is a photomicrograph of an example of the structures of $Si_3N_4$ particles epitaxially grown densely on the surfaces of SiC particles, photographed using a scanning electron microscope.

FIG. 5 illustrates the epitaxial growth of dense Si$_3$N$_4$ particles on the surfaces of SiC particles. It can be seen from the Figure that the Si$_3$N$_4$ particles are composed of fine particles of 0.2 $\mu$m or less.

Figure 6:
FIG. 6 is a photomicrograph of an example of the state of epitaxial growth of $Si_3N_4$ particles densely grown on the surfaces of SiC particles, photographed using a scanning electron microscope.

FIG. 6 shows one of SEM photomicrographs of the finally obtained sintered shapes. It can be apparant from the FIGURES that the SiC particles are bonded peripherally with the epitaxially grown Si$_3$N$_4$ whiskers/particles having a maximum pore size of not more than 10 $\mu$m.

Figure 7:
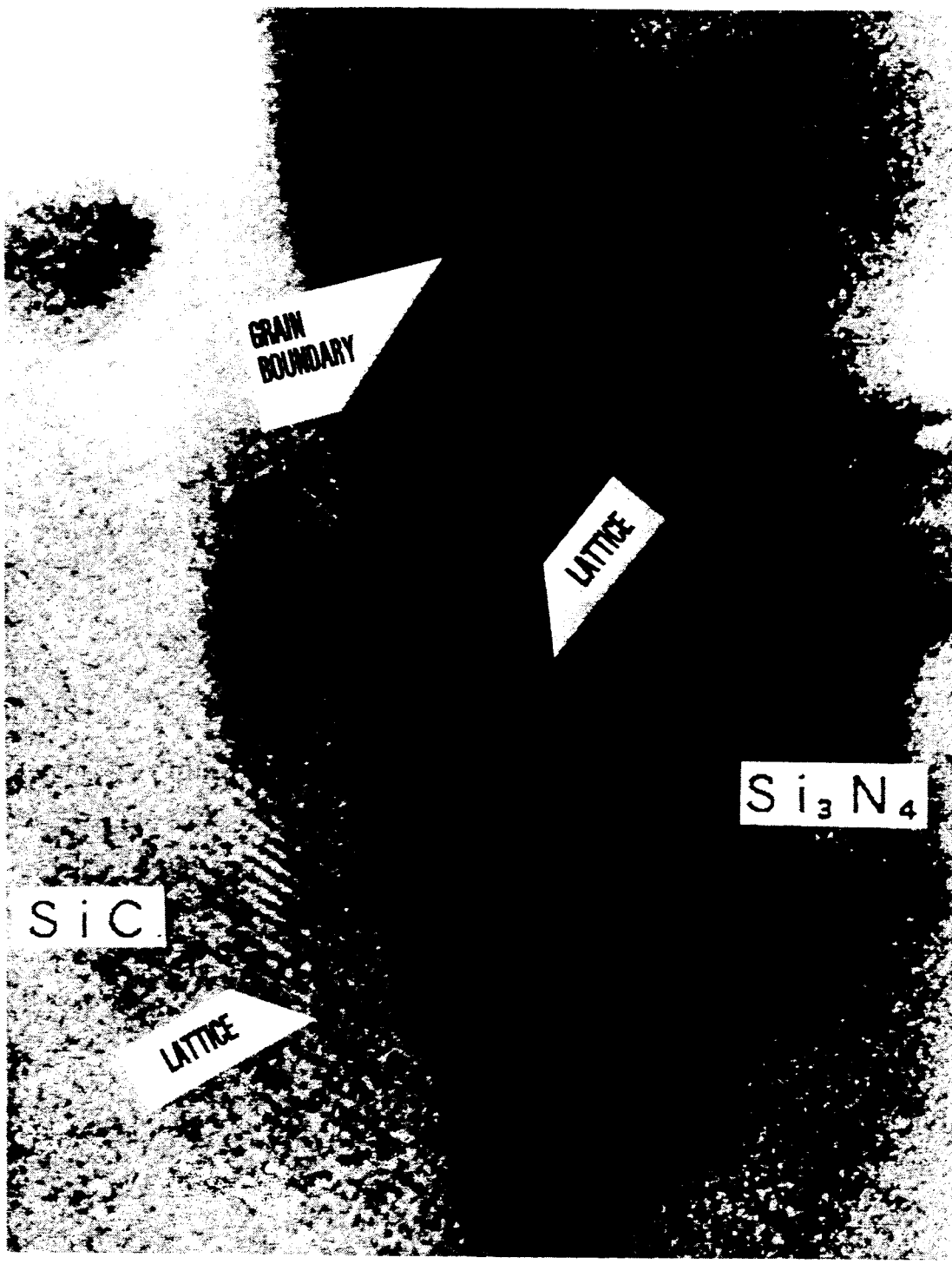
FIG. 7 is a photomicrograph of the state of epitaxial growth of $Si_3N_4$ particles on the surfaces of SiC particles observed at the grain boundaries, photographed using a transmitting electron microscope (TEM)

One of photomicrographs of grain boundaries and the vicinity thereof taken by a trasmission electron microscope (TEM) is given in FIG. 7. A lattice crossing angle between the SiC particle and the Si$_3$N$_4$ was 25 degrees. These grain boundaries were examined by an energy dispersion type X-ray analysis (EDX) and as a result, it was confirmed that no intervening material such as oxygen and the like exists. It has been found, therefore, that the products according to the present invention comprise SiC particles bonded with Si$_3$N$_4$ whiskers/-particles epitaxially grown thereon. The resultant sintered shapes have a flexure strength of 480 MPa at a temperature of 1200° C. and a Weibull modulus of 18.3 indicating production of satisfactory and reliable sintered shapes.

For comparison, a powdery mixture having a composition of 62% Si$_3$N$_4$, 30% SiC, 3% Al$_2$O$_3$, 5% Y$_2$O$_3$ by volume was prepared. This was molded in the same manner as above, hot pressed and sintered at a temperature of 1700° C. for 3 hours under a pressure of 29 MPa to obtain sintered shapes.

Figure 8:
FIG. 8 is a photomicrograph of a comparative example of $Si_3N_4$/SiC composite materials, photographed using a scanning and transmitting electron microscope (STEM)
Figure 9:
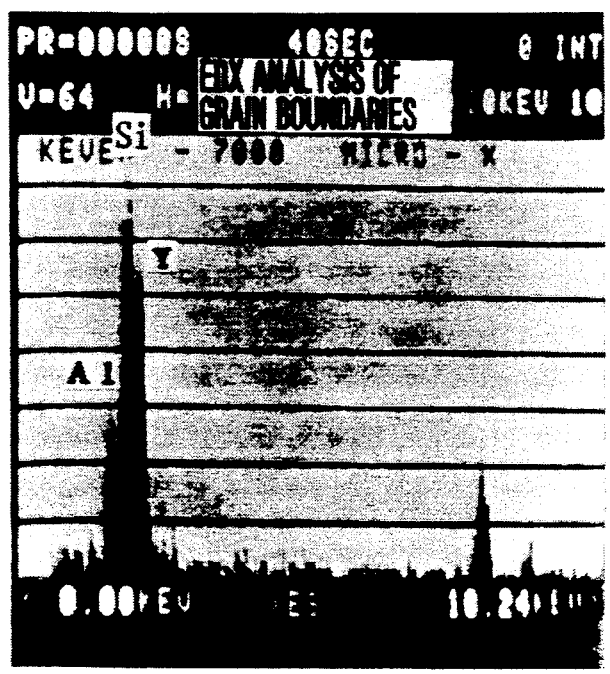
FIG. 9 is a X-ray photograph of the $Si_3N_4$/SiC at the grain boundaries as shown in FIG. 8.

One of STEM photomicrographs of the resultant sintered shapes is shown in FIG. 8. The results of the energy dispersion X-ray analysis are given in FIG. 9. It can be seen from these figures that the Si$_3$N$_4$ and SiC particles are bonded with glass phases composed of Al$_2$O$_3$ and Y$_2$O$_3$ at grain boundaries, but not with Si$_3$N$_4$ particles indicating that they are different from the sintered ceramics of the present invention. The resultant sintered shapes had a flexure strength of 180 MPa at a temperature of 1200° C. and a Weibull modulus of 7.3 indicating production of only less reliable sintered shapes.

EXAMPLES 2 TO 9

Mixtures were molded and sintered in the same manner as in Example 1, except that the SiC particles were replaced by inorganic compounds having an average particle size of 2 $\mu$m as in Table 2 to be added. As as result, in any cases, sintered shapes bonded with Si$_3$N$_4$ particles of an average particle size of 0.2 $\mu$m or less having a maximum pore size of not more than 5 $\mu$m were obtained. The sintered shapes were also examined by SEM and TEM similarly to Example 1 to confirm that Si$_4$N$_4$ particles or Si$_3$N$_4$ whiskers and particles had been epitaxially grown on the inorganic compounds.

The results are shown in Table 2 as Examples 2 to 25. For comparison, the results with inorganic compounds having a difference in electronegativity of above 1.7 are also shown as Examples 26 to 29. Those inorganic compounds having a difference in electronegativity of above 1.7 confirmed to have no Si$_3$N$_4$ whiskers/particles epitaxially grown.

TABLE 2

| Example No. | Inorg. Compound (30 vol. %) | Difference in Electronegativity | Presence of Epitaxial Bond |
|---|---|---|---|
| 2 | $Si_3N_4$ | 1.2 | Yes |
| 3 | $SiO_2$ | 1.7 | Yes |
| 4 | TiC | 1.0 | Yes |
| 5 | TiN | 1.5 | Yes |
| 6 | AlN | 1.5 | Yes |
| 7 | ZrN | 1.6 | Yes |
| 8 | ZrC | 1.1 | Yes |
| 9 | $Cr_3C_2$ | 0.9 | Yes |
| 10 | $Cr_2N$ | 1.4 | Yes |
| 11 | BeN | 1.5 | Yes |
| 12 | WC | 0.8 | Yes |
| 13 | WN | 1.3 | Yes |
| 14 | VN | 1.4 | Yes |
| 15 | VC | 0.9 | Yes |
| 16 | $Fe_3C$ | 0.7 | Yes |
| 17 | $Mo_2N$ | 1.2 | Yes |
| 18 | $Mo_2C$ | 0.7 | Yes |
| 19 | ThC | 1.2 | Yes |
| 20 | HfN | 1.7 | Yes |
| 21 | HfC | 1.2 | Yes |
| 22 | TaN | 1.5 | Yes |
| 23 | TaC | 1.0 | Yes |
| 24 | NbN | 1.4 | Yes |
| 25 | WN | 1.3 | Yes |
| 26 | $Al_2O_3$ | 2.0 | No |
| 27 | $TiO_2$ | 2.0 | No |
| 28 | $ZrO_2$ | 2.1 | No |
| 29 | MgO | 2.3 | No |

EXAMPLES 30 TO 37

To a mixture of TiN particles having an average particle size of 2 μm (a difference in electronegativity: 1.5) and powdery Si metal having an average particle size of 0.05 μm in a narrow size distribution, 10 parts by weight of polyethylene based binder were added as molding binder and the whole was mixed to provide a sample material. The material was pressed with a mechanical press under a molding pressure of 1000 kgf/cm² into disks of 50 mm in diameter×20 mm in thickness. The molding binder was removed from these shapes. The binder removed shapes were heated at a temperature of 1350° C. for a long time in an atmosphere of $NH_3$.

Figure 3:
FIG. 3 and FIG. 4 are photomicrographs of the structures of the particles of $Si_3N_4$ whiskers and grains in the process of epitaxially growing them on the surfaces of SiC particles, photographed using a scanning electron microscope (SEM)
Figure 4:
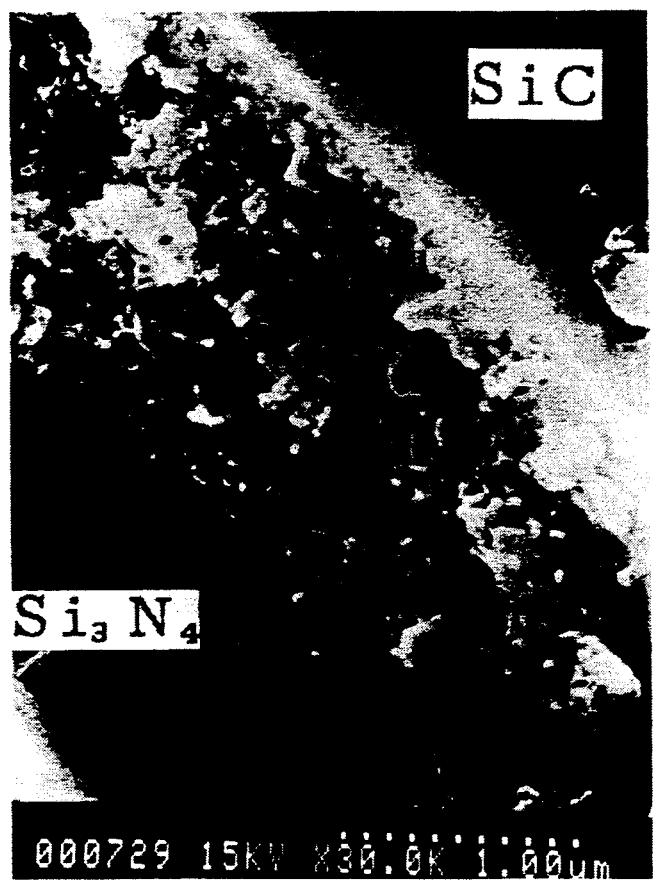

In this way there were produced sintered shapes where $Si_3N_4$ particles were epitaxially grown on the TiN particles. FIG. 3 shows a relationship between the amount of TiN particles and the properties. As can be seen from the FIGURE, if an amount of TiN is lower than 5% by volume, there is no effect of preventing crack propagaion to reduce strength with an reduction in Weibull modulus. Therefore, one can not obtain any good and reliable sintered shapes. If an amount of TiN is more than 80% by volume, insufficient bondings with epitaxially grown $Si_3N_4$ particles are achieved so as to produce only sintered shapes having a lower strength with a diminisheded Weibul coefficient. From the foregoing, it is clearly evident that an amount of TiN in the range of 5 to 80% by volume permits the increase in Weibull modulus and the enhancement of reliability

TABLE 3

| Example No. | Amount of TiN (vol. %) | Flexure strength (MPa) | Weibull Modulus |
|---|---|---|---|
| 30 | 95 | 150 | 7.5 |
| 31 | 90 | 270 | 12.8 |
| 32 | 78 | 510 | 21.2 |
| 33 | 50 | 580 | 23.4 |
| 34 | 30 | 690 | 21.8 |
| 35 | 10 | 470 | 19.5 |
| 36 | 6 | 320 | 17.5 |
| 37 | 2 | 280 | 9.7 |

EXAMPLE 38

To a mixture of SiC particles having an average particle size of 2 μm (a difference in electronegativity: 0.7) and various powdery Si metal having an average particle size in the range of 0.02 μm to 5 μm, 9 parts by weight of a polyethylene based binder were added as molding binder and the whole was mixed to provide a sample material. The material was pressed with a mechanical press under a molding pressure of 1000 kgf/cm² into disks of 50 mm in diameter×20 mm in thickness. The molding binder was removed from these shapes. The binder removed shapes were heated at a temperature of 1350° C. for a long time in an atmosphere of $N_2$.

In this way there were produced sintered shapes comprising $Si_3N_4$ particles having different average particle sizes where $Si_3N_4$ particles were epitaxially grown on the SiC particles FIG. 1 shows a relationship between the average particle size and the flexure strength. It is apparent from the Figure that the strength is rapidly increased up to near twice at the average particle size of 0.2 μm. This may be attributed to an enlargement in pore size caused when the average particle size of the Si powder is higher than 2 μm. From the pores having a maximum pore size, fractures will start to cause an reduction in strength.

EXAMPLE 39

To a mixture of TiN particles having an average particle size of 3 μm (a difference in electronegativity: 1.5) and various powdery Si metal having an average particle size in the range of 0.02 μm to 3 μm, 9 parts by weight of a polyethylene based binder were added as molding binder and the whole was mixed to provide a sample material. The material was pressed with a mechanical press under a molding pressure of 1000 kgf/cm² into disks of 50 mm in diameter×20 mm in thickness. The molding binder was removed from these shapes. The binder removed shapes were heated at a temperature of 1350° C. for a long time in an atmosphere of $N_2+H_2$.

In this way there Were produced sintered shapes having different maximum pore sizes where $Si_3N_4$ particles were epitaxially grown on the TiN particles. FIG. 2 shows a relationship between the maximum pore size and the flexure strength. As can be seen from the Figure, it has been found that the strength is rapidly enhanced at a maximum pore size of 5 μm or less to be nearly twice. This is due to occurrence of fractures starting from the pores having a maximum pore size. This means that it is very important to controll the maximum pore size to be 5 μm or less.

EXAMPLE 40

$TiO_2$ particles having an average particle size of 2 μm (a difference in electronegativity: 2.0) were treated at a temperature of 1700° C. for one hour in a nitrogen atmosphere, to form TiN films (a difference in electronegativity: 1.5) of about 100 Å in thickness. The resistant particles were mixed with powdery Si metal having an average particle size of 0.05 μm into a compositional ratio of $TiO_2$: Si=30:70% by weight with an addition of 8 parts by weight of a polystyrene based binder to produce a sample material. The material was pressed with a mechanical press under a molding pressure of 1000 kgf/cm$^2$ into disks of 50 mm in diameter×20 mm in thickness. The molding binder was removed from these shapes. The binder removed shapes were heated at a temperature of 1400° C. for a long time in an atmosphere of $N_2H_3$.

In this way there were produced sintered shapes where $Si_3N_4$ particles were epitaxially grown on the TiN films which had been formed on the $TiO_2$ particles. The produced sintered shapes had a flexure strength of 400 MPa and Weibull modulus of 18.8 indicating that they are good and reliable.

EXAMPLE 41 TO 45

Mixtures were prepared, molded and sintered in the same manner as in Example 1, except that the SiC particles were replaced by inorganic compounds having an average particle size of 2 μm added as indicated in Table 4. As a result, in any cases, sintered shapes bonded with $Si_3N_4$ particles of an average particle size of 0.2 μm or less having a maximum pore size of not more than 10 μm were obtained. It was confirmed that the sintered shapes could have a wide variety of electric resistivity from insulating properties to electroconductive properties.

TABLE 4

| Example No. | Inorganic Compound Material | Compound in Sintered Shape (vol. %) | Electric Resistivity (Ωm) |
| --- | --- | --- | --- |
| 41 | $SiO_3$ | 70 | $4 \times 10^{15}$ |
| 42 | AlN | 50 | $7 \times 10^{15}$ |
| 43 | TiN | 80 | $7 \times 10^{-7}$ |
| 44 | TiN | 30 | $8 \times 10^{-3}$ |
| 45 | ZrN | 70 | $4 \times 10^{-7}$ |

EXAMPLE 46

Figure 11:
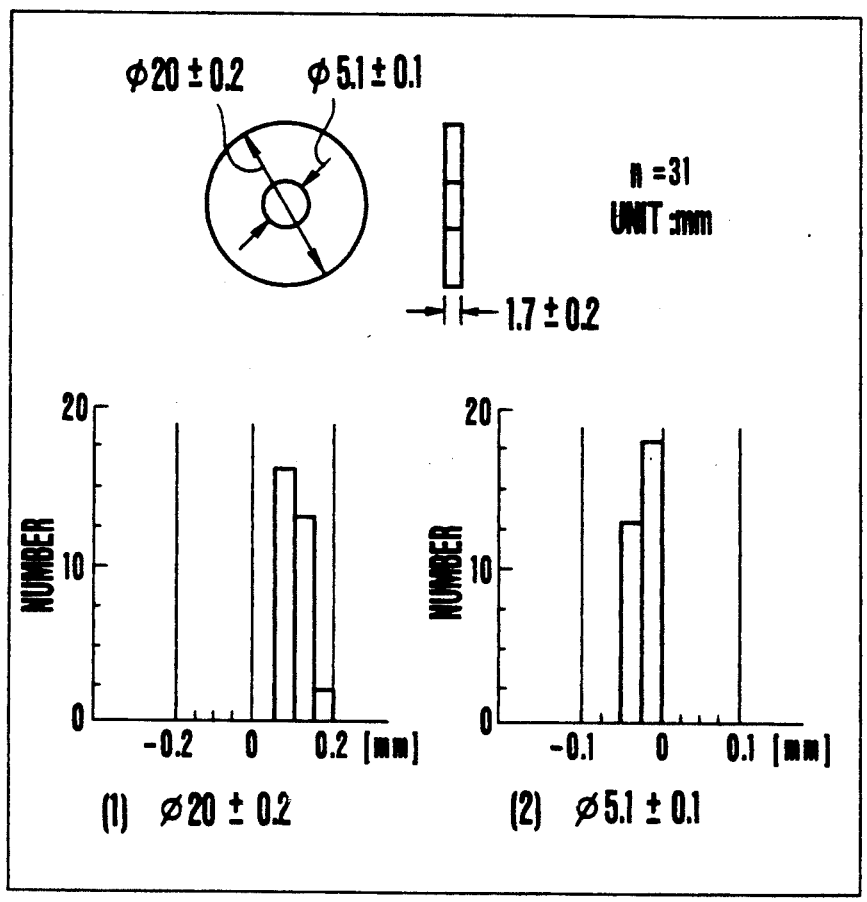
FIG. 11 and FIG. 12 are graphs showing the accuracy as expressed by a magnitude of fluctuation in dimensions of the sintered shape obtained in Example 46.

500 g of a mixture of 40 parts by weight SiC particles having an average particle size of 16 μm and 60 parts by weight powdery Si metal having an average particle size of 0.9 μm were mixed with a total 9 parts by weight of polyethylene based wax, synthetic wax, and stearic acid, as binders, and kneaded with a press kneader at a temperature of 160° C. for 5 hours. The kneaded mixture was crashed to produce a sample material. The material was pressed with a mechanical press with a metal mold of 20 mm in outside diameter and 5.1 mm in inside diameter under a molding pressure of 1000 kgf/cm$^2$ at a temperature of 160° C. The resulting shapes had a particle packing ratio of 78% by volume. These shapes, after the molding binders were removed, were heated at a rate of elevating temperature of 4° C./hour from 1100° C. to 1350° C. for a long time in a nitrogen atmosphere to produce sintered shapes. Magnitudes of the deviation in dimension of the resistant sintered shapes are shown in FIG. 11. It can be understood from the FIGURE that one can produce those being well within an acceptable tolereance in dimension.

Figure 12:
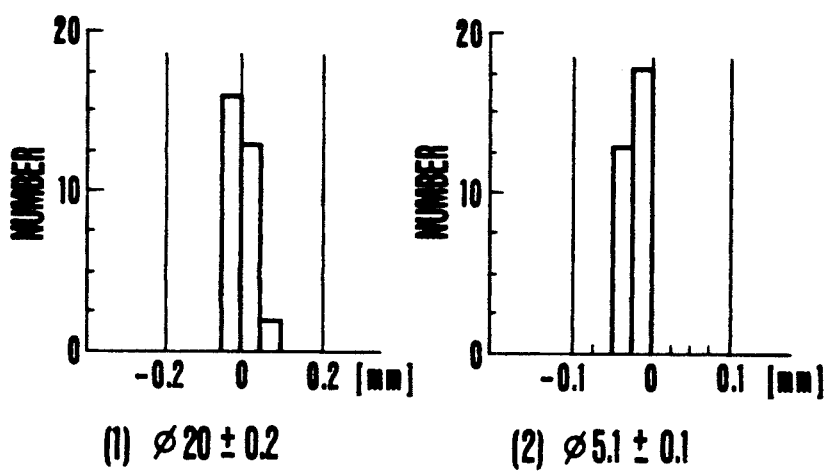

Moreover, taking account of the tolereance in dimension, the use of a metallic mold having dimensions of an outside diameter of 19.9 mm and an inside diameter of 5.1 mm could produce the sintered shapes, the magnitudes of the deviation in dimension of which are shown in FIG. 12. It should be noted from the Figure that one can produce those having a smaller magnitude of deviation than could in FIG. 11.

EXAMPLE 47

Figure 13:
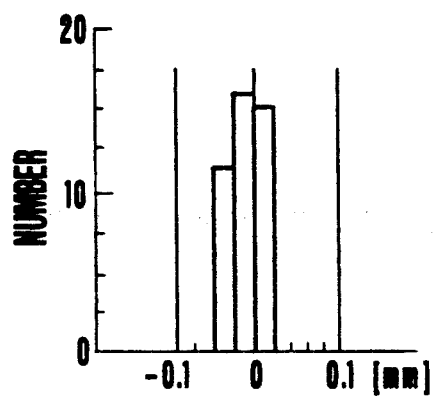
FIG. 13 is a graph showing a tolerance in outside diameters of the miniature toothed wheel manufactured in Example 47.

Small toothed wheels of the specification as shown in Table 5 were made in the same way as in Example 46. Magnitudes of the deviation in dimension of the metallic mold, the tooth configuration of the resistant molded shapes and the sintered ones are described in Table 6. In addition, the tolereance in dimension for the toothed wheels is shown in FIG. 13. From Table 6, it can be seen that a difference between the metallic mold and the curve of Involute theory is 100 μm, a difference between the molded shapes and the curve of Involute theory is 112 μm at maximum, and that a difference between the sintered shapes and the curve of involute theory is 128 μm at maximum. Therefore, a difference in dimensional tolereance between the metallic mold and the sintered shapes is very small, i.e., 28 μm. Also, the deviation in dimension is small as can be seen from FIG. 13. These toothed wheels have been confirmed to be capable of being used without any additional processing.

TABLE 5

| Specification of toothed wheel | |
| --- | --- |
| Module | 1.55 |
| Number of teeth | 18 |
| Pressure angle | 20° |
| Tooth tip diameter | 30.9 |
| Tooth width | 6 |

TABLE 6

| Object | Difference from Curve of Involute Theory |
| --- | --- |
| Metallic mold | 100 μm |
| Molded shape | 112 μm |
| Sintered shape | 128 μm |

EXAMPLE 48

Mixtures were prepared, molded and sintered in the same manner as in Example 46, except that TiN (2 μm), ZrN (2 μm), and $Al_2O_3$ (0.8 μm) were substituted for the SiC particle to produce sintered shapes. As a result, in all cases, it has been found that those within the acceptable tolereance in dimension could be manufactured as in FIG. 11. Surface roughnesses were determined to be 2 μm or less in all cases. Essentially, TiN and ZrN are effective to enhancement in surface accuracy.

EXAMPLE 49

Figure 14:
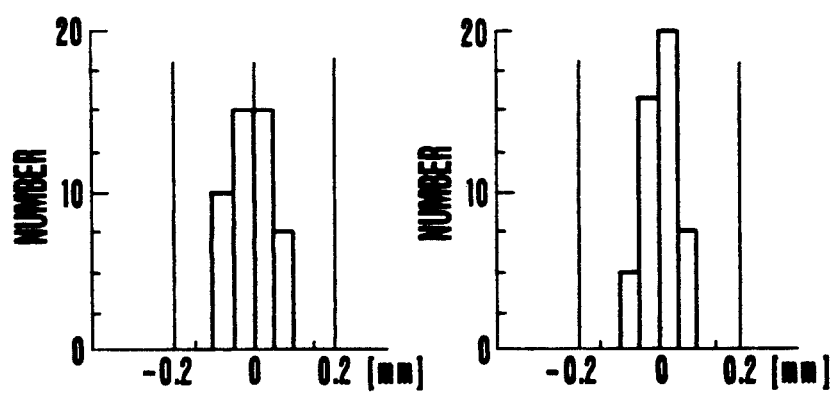
FIG. 14 is a graph showing an accuracy as expressed by a degree of fluctuation in dimensions of the sintered shape manufactured in Example 49.

A mixture of 50 parts by weight powdery Si metal having an average particle size of 0.2 μm and 50 parts by weight TiN particles having an average particle size of 2 μm were added with a total amount of 9 parts by weight of polyethylene based wax, synthetic wax, and stearic acid as binders, and kneaded with a press kneader at a temperature of 160° C. for 5 hours. The kneaded mixture was crashed to produce a sample material. The material was pressed with a mechanical press with a metallic mold of 110 mm in outside diameter and 90 mm in inside diameter under a molding pressure of 1000 kgf/cm, at a temperature of 140° C. The resulting shapes were heated at a rate of elevating temperature of 3° C./hour up to 500° C. in an argon atmosphere, and after the molding binders were removed, were heated stepwise from 500° to 1300° C. for a long time in a nitriding atmosphere to produce sintered shapes. Magnitudes of the deviation in dimension of the resistant sintered shapes are shown in FIG. 14.

What is claimed is:

1. A composite ceramic structure of sintered ceramics having a porosity of 5 to 40% by volume comprising a shape composed of particles selected from the group consisting of grains and whiskers of at least one inorganic compound selected from the group consisting of $TiO_2$, $ZrO_2$, $Cr_2O_3$, $Al_2O_3$, BeO, $Ta_2O_5$, $HfO_2$, $Nb_2O_5$ $WO_3$, $V_2O_5$ and MgO, said particles having layers coated thereon of at least one inorganic compound selected from the group consisting of SiC, $Si_3N_4$, $SiO_2$, TiC, TiN, AlN, ArN, ZrC, $Cr_3C_2$, $Cr_2N$, BeN, WC, WN, VN, VC, $Fe_3C$, $Mo_2N$, $Mo_2C$, ThC, HfN, HfC, TaN, TaC and NbN, and being bonded to one another with epitaxially grown silicon nitride particles having an average particle size of not more than 0.2 μm.

2. The composite ceramic structure according to claim 1, in which lattice crossing angles between said at least one inorganic compound selected from the group consisting of SiC, $Si_3N_4$, $SiO_2$, TiC, TiN, AlN, ArN, ArC, $Cr_3C_2$, $Cr_2N$, BeN, WC, WN, VN, VC, $Fe_3C$, $Mo_2N$, $Mo_2C$, ThC, HfN, HfC, TaN, TaC and NbN and said silicon nitride are not higher than 70°.

3. The composite ceramic structure according to claim 1, in which a compositional ratio of said inorganic compound particles including said layers to said silicon nitride is in the range of 80:20 to 5:95 by volume.

4. The composite ceramic structure according to claim 1, in which said structure has an electric resistivity in the order of $10^{-7}$ Ωm to $10^{15}$ Ωm.

5. A composite ceramic structure of sintered ceramics having a maximum pore size of 10 μm and a porosity of 5 to 40% by volume comprising a shape composed of particles selected from the group consisting of grains and whiskers of at least one inorganic compound selected from the group consisting of $TiO_2$, $ZrO_2$, $Cr_2O_3$, $Al_2O_3$, BeO, $Ta_2O_5$, $HfO_2$, $Nb_2O_5$, $WO_3$, $V_2O_5$ and MgO, said particles having layers coated thereon of at least one inorganic compound selected from the group consisting of SiC, $Si_3N_4$, $SiO_2$, TiC, TiN, AlN, ZrN, ZrC, $Cr_3C_2$, $Cr_2N$, BeN, WC, WN, VN, VC, $Fe_3C$, $Mo_2N$, $Mo_2C$, ThC, HfN, HfC, TaN, TaC and NbN, and being bonded to one another with epitaxially grown silicon nitride particles having an average particle size of not more than 0.2 μm.

6. The composite ceramic structure according to claim 5, in which said layered particles are bonded one another with crystalline silicon nitride particles epitaxially grown on the surfaces of said layered particles.

7. The composite ceramic structure according to claim 5, in which lattice crossing angles between said at least one inorganic compound selected from the group consisting of SiC, $Si_3N_4$, $SiO_2$, TiC, TiN, AlN, ZrN, ZrC, $Cr_3C_2$, $Cr_2N$, BeN, WC, WN, VN, VC, $Fe_3C$, $Mo_2N$, $Mo_2C$, ThC, HfN, HfC, TaN, TaC and NbN, and said silicon nitride are not higher than 70°.

8. The composite ceramic structure according to claim 5, in which a compositional ratio of said inorganic compound particles including said layers to said silicon nitride is in the range of 80:20 to 5:95 by volume.

9. The composite ceramic structure according to claim 5, in which said structure has an electric resistivity in the order of $10^{-7}$ Ωm to $10^{15}$ Ωm.

10. A process for producing a composite ceramic structure of sintered ceramics having a maximum pore size of not more than 10 μm and a porosity of 5 to 40% by volume comprising forming layers of at least one second inorganic compound selected from the group consisting of SiC, $Si_3N_4$, $SiO_2$, TiC, TiN, AlN, ZrN, ZrC, $Cr_3C_2$, $Cr_2N$, BeN, WC, WN, VN, VC, $Fe_3C$, $Mo_2N$, ThC, HfN, HfC, TaN, TaC and NbN, on the surfaces of particles of at least one first inorganic compound selected from the group consisting of $TiO_2$, $ZrO_2$, $Cr_2O_3$, $Al_2O_3$, BeN, $Ta_2O_5$, $HfO_2$, $Nb_2O_5$, $WO_3$, $V_2O_5$ and MgO, shaping said layered particles to produce a shape, sintering said shape at a temperature ranging from the vaporization temperature of silicon to 1400° C. in a gaseous atmosphere containing silicon and nitrogen to grow silicon nitride particles having an average particle size of not more than 0.2 μm on the surfaces of said layered particles, thereby bonding said layered particles to one another.

11. A process for producing a composite ceramic structure of sintered ceramics having a maximum pore size of not more than 10 μm and a porosity of 5 to 40% by volume comprising forming layers of at least one second inorganic compound selected from the group consisting of SiC, $Si_3N_4$, $SiO_2$, TiC, TiN, AlN, ZrN, ZrC, $Cr_3C_2$, $Cr_2N$, BeO, WC, WN, VN, VC, $Fe_3C$, $Mo_2N$, $Mo_2C$, ThC, HfN, HfC, TaN, TaC and NbN, on the surfaces of particles of at least one first inorganic compound selected from the group consisting of $TiO_2$, $ZrO_2$, $Cr_2O_3$, $Al_2O_3$, BeO, $Ta_2O_5$, $HfO_2$, $Nb_2O_5$, $WO_3$, $V_2O_5$ and MgO, mixing the resultant layered particles with powdery silicon metal having an average particle size of not more than 0.3 μm, shaping the resultant mixture to produce a shape, sintering said shape at a temperature ranging from the vaporization temperature of silicon to 1400° C. in a nitriding atmosphere to epitaxially grow silicon nitride particles having an average particle size of not more than 0.2 μm on the surfaces of said layered particles, thereby bonding said layered particles to one another.

* * * * *